(12) United States Patent
David et al.

(10) Patent No.: US 11,862,069 B2
(45) Date of Patent: Jan. 2, 2024

(54) BASELINE AND SHAPED PULSE DRIVING FOR MICRO-LIGHT EMITTING DIODE DISPLAY

(71) Applicant: GOOGLE LLC, Mountain View, CA (US)

(72) Inventors: Aurelien Jean Francois David, San Francisco, CA (US); Patrick F. Brinkley, San Mateo, CA (US); Carlin Vieri, Menlo Park, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/687,020

(22) Filed: Mar. 4, 2022

(65) Prior Publication Data
US 2022/0310000 A1 Sep. 29, 2022

Related U.S. Application Data

(63) Continuation of application No. PCT/US2021/023601, filed on Mar. 23, 2021.

(51) Int. Cl.
*G09G 3/32* (2016.01)

(52) U.S. Cl.
CPC ........... *G09G 3/32* (2013.01); *G09G 2310/08* (2013.01); *G09G 2330/021* (2013.01)

(58) Field of Classification Search
CPC .................. G09G 3/32; G09G 2310/08; G09G 2330/021; G09G 2310/0251; G09G 3/3225; G09G 2320/0252; H01L 25/0753
See application file for complete search history.

(56) References Cited

U.S. PATENT DOCUMENTS

| | | | |
|---|---|---|---|
| 8,791,647 B2 | 7/2014 | Kesterson et al. | |
| 10,028,348 B2 | 7/2018 | Sasaki et al. | |
| 2003/0107536 A1 | 6/2003 | Ishizuka et al. | |
| 2014/0055500 A1* | 2/2014 | Lai | G09G 3/006 345/77 |
| 2015/0364089 A1 | 12/2015 | Pyo et al. | |

(Continued)

FOREIGN PATENT DOCUMENTS

CN 110581206 A 12/2019

OTHER PUBLICATIONS

International Search Report and Written Opinion dated May 27, 2021 for PCT/US2021/023601, 15 pages.

(Continued)

*Primary Examiner* — Muhammad N Edun
(74) *Attorney, Agent, or Firm* — Brake Hughes Bellermann LLP

(57) ABSTRACT

A micro-LED driver applies a low baseline power (i.e., a baseline voltage or current) to pre-charge a micro-LED in a nominally-off (i.e., non-light-emitting) state in addition to applying an operating driving power to drive the micro-LED in a light-emitting state. By pre-charging the micro-LED prior to applying the operating driving power, the micro-LED driver significantly decreases the time between application of the operating driving power and onset of emission of light from the micro-LED. In some embodiments, the micro-LED driver applies an operating driving power having multiple phases of current density to reduce the time between application of the operating driving power and onset of emission of light from the micro-LED.

20 Claims, 8 Drawing Sheets

(56) References Cited

U.S. PATENT DOCUMENTS

2019/0132924 A1* 5/2019 Fan ..................... H05B 45/397
2019/0306945 A1   10/2019 Valentine
2020/0211427 A1*  7/2020 Pappas ............... G01R 31/2635

OTHER PUBLICATIONS

David, Aurelien et al., "Carrier Dynamics and Coulomb-Enhanced Capture in III-Nitride Quantum Heterostructures," Applied Physics Letters 109, 033504; doi: 10.1063/1.4959143, Jul. 20, 2016; 6 pages.

David, Aurelien et al., "Electrical Properties of III-Nitride LEDs: Recombination-Based Injection Model and Theoretical Limits to Electrical Efficiency and Electroluminescent Cooling," Applied Physics Letters, 109(8); Sep. 1, 2016; 5 pages.

Esquivias, I. et al., "Carrier Dynamics and Microwave Characteristics GaAs QW Lasers," IEEE Journal of Quantum Electronics, vol. 35, No. 4; Apr. 1999, pp. 635-646.

Lee, T.P., "Effect of Junction Capacitance on Rise Time of LED and Laser," The Bell System Technical Journal, vol. 54, No. 1; Jan. 1975; 16 pages.

Tucker, R. et al., "Microwave Circuit Models of Semiconductor Injection Lasers," IEEE Transactions on Microwave Theory and Techniques, vol. MTT-31, No. 3; Mar. 2983; pp. 289-294.

Weisser, S. et al., "Impedance Characteristics of Quantum-Well Lasers," IEEE Photonic Technologu Letters, vol. 6, No. 12; Dec. 1994; pp. 1421-1423.

* cited by examiner

BASELINE AND SHAPED PULSE DRIVING FOR MICRO-LIGHT EMITTING DIODE DISPLAY

CROSS-REFERENCE TO RELATED APPLICATIONS

The present application is a continuation application of International Application No. PCT/US2021/023601, entitled "BASELINE AND SHAPED PULSE DRIVING FOR MICRO-LIGHT EMITTING DIODE DISPLAY", and filed on Mar. 23, 2021, the entirety of which is incorporated by reference herein.

BACKGROUND

A display panel includes an array of pixels arranged in rows and columns, typically having on the order of thousands or even tens-of-thousands of rows and columns. Each pixel may be implemented as a matrix of sub-pixels, such as a particular arrangement of red, green, and blue (RGB) sub-pixels, each of which is controlled to emit light of the corresponding color at a corresponding luminance, and the combination of light colors and their luminance results in the intended brightness and color for the pixel as a whole. Light emitting diode (LED) displays include an array of LEDs forming the sub-pixels, with drivers that employ pulse width modulation (PWM) to modulate the LEDs between an off- and an on-state to display images, with a modulation frequency in the kHz range. The rise and fall times of the LEDs are commensurate with a kHz-range frequency, providing an adequate response time for displaying images at the frequency of the PWM. Future displays are expected to include micro-LEDs with pixels having a lateral dimension that is smaller than 50 µm. The micro-displays are expected to include light-emitting elements (i.e., micro-LEDs) and a driver to feed a current pulse to the light-emitting elements.

It is an object of the present disclosure to provide an improved method and of driving micro-LEDs that obviates or mitigates one or more problems associated with known methods, whether identified herein or otherwise.

SUMMARY

According to a general aspect, a micro-LED driver applies a low baseline power (i.e., a baseline voltage or current) to pre-charge a micro-LED in a nominally-off (i.e., non-light-emitting) state in addition to applying an operating driving power to drive the micro-LED in a light-emitting state. By pre-charging the micro-LED prior to applying the operating driving power, the micro-LED driver significantly decreases the time between application of the operating driving power and onset of emission of light from the micro-LED. In some embodiments, the micro-LED driver applies an operating driving power having multiple phases of current density to reduce the time between application of the operating driving power and onset of emission of light from the micro-LED.

According to a first aspect, there is provided a method comprising driving a first micro light emitting diode (micro-LED) having a lateral dimension that is smaller than 20 µm in a nominally-off state at a first baseline power greater than zero. The method further comprises driving the first micro-LED in a light-emitting state at a power greater than the first baseline power, wherein an amount of light emitted by the first micro-LED in the nominally-off state is negligible compared to a minimum amount of light emitted by the first micro-LED in the light-emitting state.

Driving the first micro-LED at the first baseline power may comprise applying the first baseline power prior to driving the first micro-LED in the light-emitting state.

Driving the first micro-LED in the nominally-off state may be performed immediately prior to driving the first micro-LED in the light-emitting state.

The method may further comprise driving a second micro-LED in a nominally-off state at a second baseline power greater than zero. The second baseline power may be different from the first baseline power. The method may further comprise driving the second micro-LED in a light-emitting state at a power greater than the second baseline power.

The first micro-LED and the second micro-LED may emit different color light from one another.

Driving the first micro-LED in the light-emitting state may comprise driving the first micro-LED with a current pulse comprising a first phase having a relatively higher current density and a second phase having a relatively lower current density. The first phase may immediately precede the second phase. The first phase may have a current density at least twice the current density of the second phase.

The method may further comprise driving a second micro-LED in a light-emitting state. Driving the second micro-LED in the light-emitting state may comprise driving the second micro-LED with a current pulse comprising a second micro-LED first phase having a relatively higher current density and a second micro-LED second phase having a relatively lower current density. The second micro-LED first phase may immediately precede the second micro-LED second phase. The second micro-LED first phase may have a current density at least twice the current density of the second micro-LED second phase.

The amount of light emitted by the micro-LED in the nominally-off state may be less than 0.1% of the minimum amount of light emitted by the first micro-LED in the light-emitting state and the light-emitting state may be characterized by an internal quantum efficiency of at least 10%.

Driving the first micro-LED in the nominally-off state may comprise driving the first micro-LED via a first power path. Driving the first micro-LED in the light-emitting state may comprise driving the first micro-LED via a second power path different from the first power path.

Driving the first micro-LED via the first power path may comprise supplying power to the first micro-LED via the first power path. Driving the first micro-LED via the second power path may comprise supplying power to the first micro-LED via the second power path.

The first power path may comprise at least one of a transistor or a resistor.

A turn-on time between the nominally-off state and the light-emitting state may be less than 500 ns.

According to a further aspect there is provided a method comprising driving a first micro light emitting diode (micro-LED) of a display comprising an array of micro-LEDs, each micro-LED in the array having a lateral dimension that is smaller than 20 µm, in a light-emitting state with a current pulse comprising a first phase having a relatively higher current density and a second phase having a relatively lower current density, wherein the current pulse has a duration that is shorter than 1 microsecond and wherein the light-emitting state extends for at least 50% of the current pulse duration.

The first phase may immediately precede the second phase.

The first phase may have a current density at least twice the current density of the second phase.

The method may further comprise driving the first micro-LED in a nominally-off state at a first baseline power greater than zero. The method may further comprise driving the first micro-LED in the light-emitting state at a power greater than the first baseline power, wherein an amount of light emitted by the micro-LED in the nominally-off state is negligible compared to a minimum amount of light emitted by the first micro-LED in the light-emitting state.

Driving the first micro-LED at the first baseline power may comprise applying the first baseline power prior to driving the first micro-LED in the light-emitting state.

Driving the first micro-LED in the nominally-off state may be performed immediately prior to driving the first micro-LED in the light-emitting state.

The method may further comprise driving a second micro-LED in a nominally-off state at a second baseline power greater than zero, wherein the second baseline power is different from the first baseline power. The method may further comprise driving the second micro-LED in a light-emitting state at a power greater than the second baseline power.

The first micro-LED and the second micro-LED may emit different color light from one another.

Driving the first micro-LED in the nominally-off state may comprise driving the first micro-LED via a first power path. Driving the first micro-LED in the light-emitting state may comprise driving the first micro-LED via a second power path different from the first power path.

Driving the first micro-LED via the first power path may comprise supplying power to the first micro-LED via the first power path. Driving the first micro-LED via the second power path may comprise supplying power to the first micro-LED via the second power path.

The amount of light emitted by the micro-LED in the nominally-off state may be less than 0.1% of the minimum amount of light emitted by the first micro-LED in the light-emitting state and the light-emitting state may be characterized by an internal quantum efficiency of at least 10%.

According to a further aspect there is provided a device comprising a first micro light emitting diode (micro-LED) having a lateral dimension that is smaller than 20 μm and a driver. The driver is configured to drive the first micro-LED in a nominally-off state at a first baseline power greater than zero; and drive the first micro-LED in a light-emitting state at a power greater than the first baseline power, wherein an amount of light emitted by the micro-LED in the nominally-off state is negligible compared to a minimum amount of light emitted by the first micro-LED in the light-emitting state.

The driver may be further configured to apply the first baseline power to the first micro-LED prior to driving the first micro-LED in the light-emitting state.

The driver may be further configured to apply the first baseline power to the first micro-LED immediately prior to driving the first micro-LED in the light-emitting state.

The device may further comprise a second micro-LED. The driver may be configured to drive the second micro-LED in a nominally-off state at a second baseline power greater than zero. The second baseline power may be different from the first baseline power. The first micro-LED and the second micro-LED may emit different color light from one another. The method may further comprise driving the second micro-LED in a light-emitting state at a power greater than the second baseline power.

The driver may be further configured to drive the first micro-LED in the light-emitting state with a current pulse comprising a first phase having a relatively higher current density and a second phase having a relatively lower current density. The driver may be further configured to drive the micro-LED in the light-emitting state by applying a non-linear conversion between the desired LED brightness and the current pulse duration.

The amount of light emitted by the micro-LED in the nominally-off state may be less than 0.1% of the minimum amount of light emitted by the first micro-LED in the light-emitting state and the light-emitting state may be characterized by an internal quantum efficiency of at least 10%.

The driver may comprise a first power path to drive the first micro-LED in the nominally-off state at the first baseline power and a second power path different from the first power path to drive the first micro-LED in the light-emitting state.

It will be understood that features described in the context of one aspect of the disclosure may be combined with features of other aspects of the disclosure. For example, features described in the context of one of the methods described above may be combined with features of the other method described above. Similarly, features described in the context of either of the methods described above may be combined with features of the device also described above, and vice versa.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
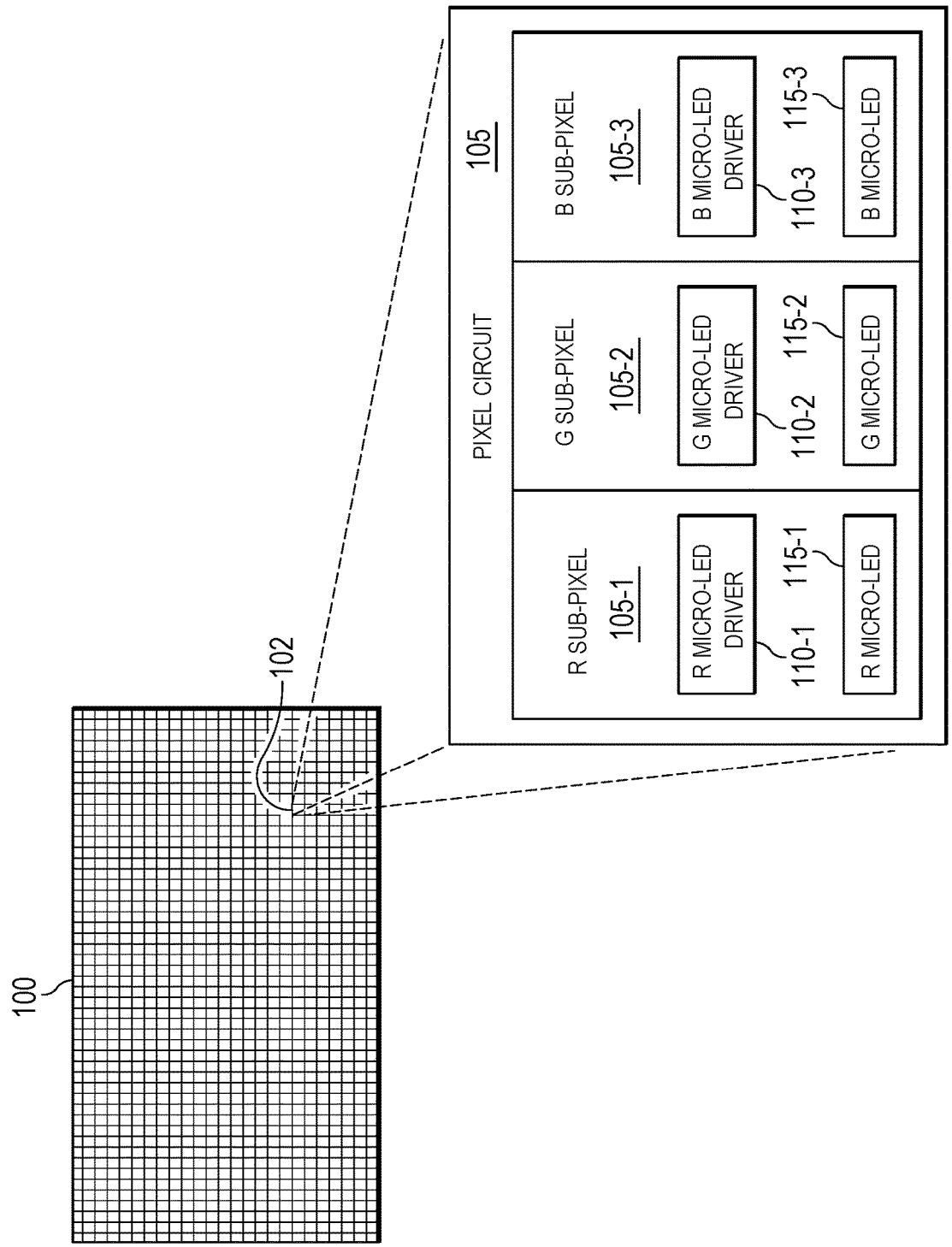
FIG. 1 is a diagram illustrating a display made up of an array of pixels.

The following description is intended to convey a thorough understanding of the present disclosure by providing a number of specific embodiments and details involving display systems utilizing micro-light emitting diodes (micro-LEDs). It is understood, however, that the present disclosure is not limited to these specific embodiments and details, which are examples only, and the scope of the disclosure is accordingly intended to be limited only by the following claims and equivalents thereof. It is further understood that one possessing ordinary skill in the art, in light of known systems and methods, would appreciate the use of the disclosure for its intended purposes and benefits in any number of alternative embodiments, depending upon specific design and other needs.

In some display applications in which the pixel architecture for the pixels is implemented as micro-LEDs, such as augmented reality/virtual reality (AR/VR) systems, projectors, phones, tablets, laptops, televisions, and plasma displays, a faster modulation speed than the kilo-Hertz range of conventional LED drivers is required. In some cases, pulses shorter than 1 μs, or even shorter than 100 ns, are required to meet specifications for a satisfactory user experience. Although micro-LEDs are small and therefore have a small capacitance, the rise time for a high-quality micro-LED to switch from a fully-off state to an on-state in which the micro-LED is emitting light can be substantially longer than 100 ns, on the order of tens or hundreds of nanoseconds when using conventional driving techniques.

FIGS. 1-9 illustrate techniques for driving micro-LEDs having lateral dimension that is smaller than 20 μm to reduce the response time of the micro-LEDs. In some embodiments, a micro-LED driver applies a low baseline power (i.e., a baseline voltage or current) to pre-charge a micro-LED in a nominally-off (i.e., non-light-emitting) state in addition to applying an operating driving power to drive the micro-LED in a light-emitting state. By applying the low baseline power to pre-charge the micro-LED prior to applying the operating driving power, the micro-LED driver significantly decreases the time between application of the operating driving power and onset of emission of light from the micro-LED.

The micro-LED driver applies the low baseline power at all times in some embodiments, and in other embodiments, the micro-LED driver conserves power by applying the low baseline power at all times only to specific areas of the display, such as a banner at the top of the display to show icons, that remain illuminated while the remaining areas of the display are off when the display is in a particular operation mode. In some embodiments, the micro-LED driver includes a timing circuit that applies the low baseline power to a set of pixels a short time before that set of pixels will become active. The micro-LED driver applies the low baseline power only to active pixels (i.e., non-dark pixels) in some embodiments. In some embodiments, the micro-LED driver uses a primary power path to supply the operating driving power to drive the micro-LED in the light-emitting state and a secondary power path to supply the baseline power to pre-charge the micro-LED prior to application of the operating driving power.

In some embodiments, the micro-LED driver applies an operating driving power having multiple phases of current density (referred to herein as a "shaped pulse") to reduce the time between application of the operating driving power and onset of emission of light from the micro-LED. For example, by applying an initial phase having a relatively high current density followed by a second phase having a lower current density, the micro-LED driver reduces the capacitance charging time of the micro-LED. The micro-LED driver applies a shaped pulse instead of, or in addition to, a low baseline power pre-charge of the micro-LED in some embodiments.

In various embodiments, the techniques described herein apply to time-dependent driving of optoelectronic emitters, including LEDs and more particularly micro-LED displays. The terms pulse and power pulse are used herein to generally describe a time-dependent driving scheme, alternating between relatively low input power (i.e., off or nearly off) and a relatively high input power during which light is emitted. The pulses may be current pulses, or voltage, or power pulses. The examples disclosed herein consider a III-nitride LED. However, some of the techniques are applicable to other optoelectronic devices, including semiconductor LEDs (e.g., GaAs, AlInGaP, AlInGaAsP, III-V and II-VI compounds), organic LEDs, perovskites and other materials known in the art.

FIG. 1 is a diagram of a display 100 made up of an array of pixels, such as pixel 102. Each pixel includes a pixel circuit such as pixel circuit 105, which includes three sub-pixels: red (R) sub-pixel 105-1, green (G) sub-pixel 105-2, and blue (B) sub-pixel 105-3. Each sub-pixel includes a micro-LED driver and a micro-LED that emits light when the micro-LED driver applies power to the micro-LED. Thus, R sub-pixel 105-1 includes R micro-LED driver 110-1, which applies power to R micro-LED 115-1 and causes R micro-LED 115-1 to emit light. Similarly, G sub-pixel 105-2 includes G micro-LED driver 110-2, which applies power to G micro-LED 115-2, and B sub-pixel 105-3 includes B micro-LED driver 110-3, which applies power to B micro-LED 115-3. In some embodiments, the display 100 is used in a flat panel display, mobile device display, head-mounted display, or other display format. In some embodiments, the display 100 includes thousands of pixel circuits. In some embodiments, the micro-LED drivers 110-1, 110-2, 110-3 improve the response time of the micro-LEDs 115-1, 115-2, 115-3 by driving the corresponding micro-LEDs at a baseline power when the micro-LEDs are in a nominally-off state, wherein the baseline power is greater than a zero-power level, or by applying a power pulse having a shaped current density to the micro-LEDs. This can be better understood with reference to FIG. 2.

Figure 2:
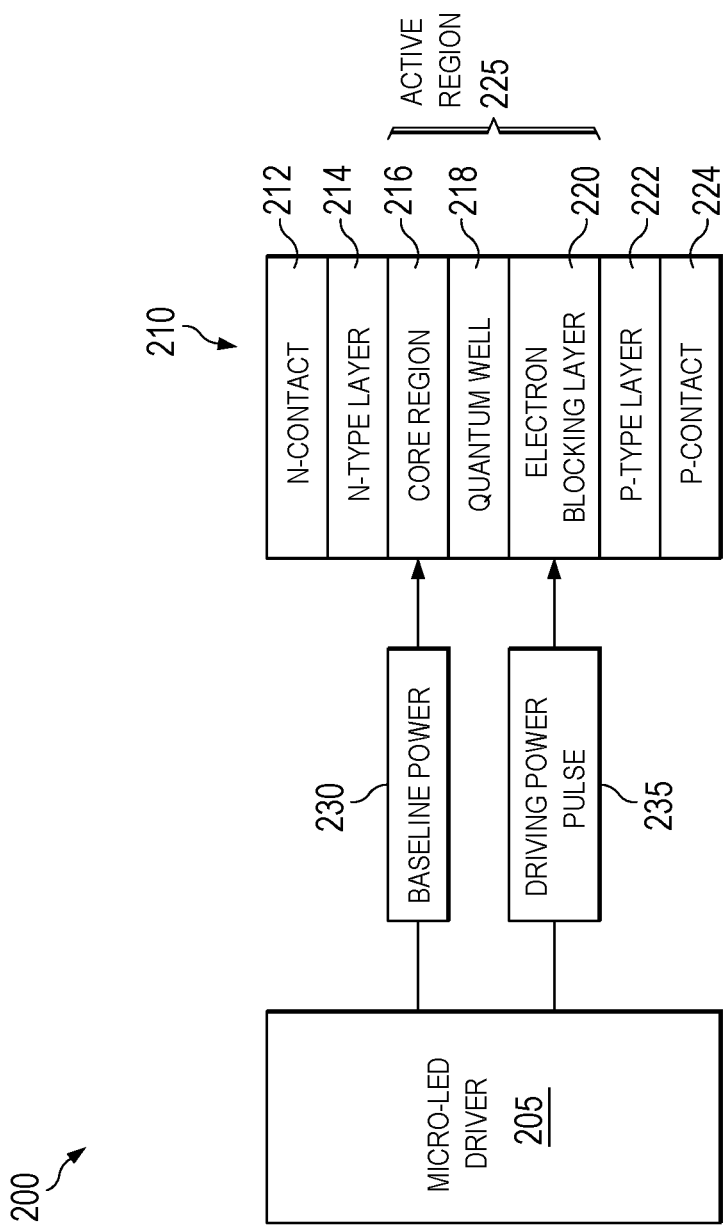
FIG. 2 is a block diagram illustrating a micro-LED display element including a micro-LED driver that supplies a baseline power and a driving power pulse to a micro-LED in accordance with some embodiments.

FIG. 2 is a block diagram illustrating a micro-LED display element 200 corresponding to one of the sub-pixels 105-1, 105-2, 105-3 of FIG. 1 including a micro-LED driver 205 corresponding to one of the micro-LED drivers 110-1, 110-2, 110-3 of FIG. 1 that supplies a baseline power 230 and a driving power pulse 235 to a micro-LED 210 corresponding to one of the micro-LEDs 115-1, 115-2, 115-3 of FIG. 1 in accordance with some embodiments. The micro-LED 210 has a lateral dimension that is smaller than 20 μm and includes n-contact 212 and p-contact 224 layers, an n-type layer 214 and a p-type layer 222, and an active (light-emitting) region 225 including a core region 216, a quantum well 218, and an electron blocking layer 220. The micro-LED driver 205 applies the driving power pulse 235 to the micro-LED 210 to cause the micro-LED 210 to emit light having an intensity commensurate with the amplitude of the driving power pulse 235. Part of the current of the driving power pulse 235 is consumed by charging the active region 225, which is characterized by a capacitance per area. The remaining current of the driving power pulse 235 is injected as free carriers in the core region 216, where carriers can be captured by the light emitting layers of the active region 225. Once in the light emitting layers, the carriers are consumed by recombinations.

However, the response of the micro-LED 210 is limited by the time it takes to charge the capacitance of the micro-LED 210, starting from an off-state in which no voltage or current is applied, which causes a delay in light emission. In addition, the recombination lifetime in the micro-LED 210 can be slow, especially at turn-on, limiting the rise time of the light output. The micro-LED 210 is characterized by a turn-on time $\tau_{on}$, which is defined as the time the micro-LED 210 takes from the onset of the driving power pulse 235 until the micro-LED 210 reaches 90% of the light output plateau level for the driving power pulse 235. The micro-LED 210 is further characterized by a turn-off time $\tau_{off}$, which is defined as the time the micro-LED 210 takes after the end of the driving power pulse 235 (i.e., the start of the falling edge of the driving power pulse 235) to reach 10% of the light output plateau level of the micro-LED 210.

Some embodiments are characterized by an asymmetric time response, wherein the turn-off time and the turn-on time are substantially different. In some embodiments, a micro-LED is driven by a power pulse and is characterized by turn-on and turn-off times, and the ratio tau_on/tau_off is higher than 1.5 (or 2, 5, 10) or is lower than 1/1.5 (or ½, ⅕, 1/10). Such asymmetric behavior may distinguish the time-response of some embodiments from that of conventional optoelectronic devices.

Some embodiments minimize the asymmetry of the time response, by matching the rise and fall times with approaches disclosed herein. Other embodiments use a substantially asymmetric response. In addition, by shaping the current density of the driving power pulse 235, the micro-LED driver 205 further shortens the response time of the micro-LED 210 and controls the turn-off time $\tau_{off}$.

By feeding a baseline power 230 to the micro-LED 210, the micro-LED driver 205 reduces the turn-on time $\tau_{on}$. The baseline power 230 is a current and/or voltage that is higher than zero that is applied when the micro-LED 210 is in a nominally-off state, in which the micro-LED 210 is not expected to emit light. In some embodiments, the amplitude of the baseline power 230 is selected such that the amount of light emitted by the micro-LED 210 in the nominally-off (baseline) state is negligible compared to the amount of light emitted by the micro-LED 210 in an on (light-emitting) state. For example, in some embodiments the amount of light emitted in the nominally-off state is 10% or less of the amount of light emitted in the light-emitting state. In other embodiments, the amount of light emitted in the nominally-off state is 1% or less of the amount of light emitted in the light-emitting state. In still other embodiments, the amount of light emitted in the nominally-off state is 0.1% or less of the amount of light emitted in the light-emitting state. The amount of light emitted in the light emitting state may vary significantly. For example, light emission from a micro-LED pixel may range from a maximum of 1000 cd/m2 to a minimum of 0.1 cd/m2). In some embodiments, the amount of light emitted in the baseline state is at most approximately 10% of the minimum amount emitted (e.g. if 0.1 cd/m2 is the minimum light emitted in the light emitting state, in the baseline state the micro-LED is limited to emitting 0.01 cd/m2 or less).

In some embodiments, the structure of the micro-LED 210 is configured to improve the time response, including the time response associated to the capacitance and/or to the recombination time. In some embodiments, the LED is configured to achieve a desired capacitance per area, such as by maintaining the capacitance per area below a predetermined value. In some embodiments, the core region 216 of the micro-LED 210 has a thickness d (also referred to as the depletion thickness d), and the space-charge capacitance per unit area is approximately given by Csc=eps/d, wherein eps is the dielectric constant of the material. For example, for GaN, eps is approximately 10*eps0 at zero bias, wherein eps0 is the vacuum permittivity; the value under forward bias increases, e.g., by approximately a factor of two, as C=Csc*(1−V/Voc)−½ wherein Voc is the open-circuit voltage.

In some embodiments, the value of d is approximately equal to the thickness of the undoped region between the p and n regions (i.e., d~tc).

By selecting the structure of the active region (e.g., quantum wells (QWs), barriers, spacing layers), embodiments facilitate tc to be selected separately from the active region thickness tw. This contrasts these embodiments from homojunction LEDs, in which recombinations occur across a substantial portion of the depletion thickness. A large value of tc facilitates a lower capacitance, whereas the value of tw may be selected to achieve a suitable efficiency. In some embodiments, the thickness of the depletion region is at least 2 times (or 5, 10, 20 times) the thickness of the light-emitting layers.

For instance, some embodiments include only a few, thin QWs and thin barriers, but have a sufficient value of d to reduce Csc. To this effect, some embodiments employ dummy QWs (i.e., QWs of lower composition than the light-emitting QWs, which promote carrier transport but do not emit light, thus ensuring that carriers reach the light-emitting QWs) to increase d without adversely impacting the injection efficiency. Dummy QWs may be placed on either the p-, the n-, or both sides of the light-emitting QWs, or be interspersed with them. Some embodiments configure the epitaxial layer (not shown) to achieve a desired capacitance, independent of the thickness of the light-emitting QWs and barriers. Some embodiments employ other active region designs, including double heterostructures, layers of varying composition (stepped or graded), and/or alloys of AlGaN, InGaN, AlInN, AlInGaN.

In some embodiments, the value of d is selected to reduce the value of Csc. For instance, Csc may be below 1E-7 F·cm-2 (or 5E-8, 2E-8, 1E-8, 5E-9, 1 E-9 F·cm-2). In some embodiments, the value of d and the LED's area A are selected to reduce the value of the net LED capacitance Csc*A. For instance, the net LED capacitance is less than 1E-13 F (or 5E-14, 1E-14, 5E-15, 1E-15, 5E-16, 1E-16 F). In some embodiments, micro-LED pixels or subpixels have a lateral dimension of less than 10 um (or 5 um, 3 um, 2 um, 1 um).

In some embodiments, the rise time associated with the capacitance charging is tau_charge=V*Csc/J, wherein V is the typical operating voltage (about 2.5-3 V for common visible LEDs) and J is the current density. Accordingly, in some embodiments, the LED configuration and the choice of the operation current density jointly yield a sufficiently fast rise time. In some embodiments, the ratio Csc/J is less than 1 E-8 F/A (or 5E-9, 1E-9, 5E-10, 1E-10 F/A). In some embodiments, tau_charge is less than 100 ns (or 50 ns, 10 ns, 5 ns, 1 ns). In some embodiments, tau_charge is shorter than the time duration T of the pulse (or shorter than 0.5*T or 0.2*T or 0.1*T).

In some embodiments, doping levels in the p- and n-doped regions 214, 222 of the micro-LED 210 are selected to control the depletion width. In some embodiments, an abrupt transition from undoped to doped layers is formed. Some embodiments have an n-doped layer 214 (with a doping level of at least 1E18 cm-3, or 1E19 cm-3), followed by a nominally-undoped region (doping level less than 1E17 cm-3) containing light-emitting layers, followed by a p-doped active region 222 (doping level of at least 1E18 cm-3, or 1E19 cm-3). Such doping levels may be combined with other LED characteristics (such as the width of an undoped region) to yield a desired capacitance value.

In some embodiments, the micro-LED 210 is configured to achieve a predetermined dynamic resistance rho=dV/dJ to facilitate avoidance of an interaction of the dynamic resistance with parasitic capacitances, which may lead to further delays in time response. In some embodiments, the dynamic resistance per area is maintained below a desired value in the nominally-off state by, for example, applying a baseline low current to the micro-LED 210 in its nominally-off state. In some embodiments, the dynamic resistance in the nominally-off state is less than 100 ohm·cm2 (or 10, 1, 0.1 ohm·cm2).

In some cases, there may be a trade-off between material quality and response time. For example, a defective LED has a lower internal quantum efficiency (IQE), which results in inefficient operation, but has a faster non-radiative recombination time due to SRH recombination, or other kinds of defect-related recombinations (e.g., defect-induced leakage or tunneling) which improves the modulation speed. In some embodiments, the defect level is selected to facilitate operation at a given speed. For instance, a desired modulation speed is selected, and the defect level in the LED is controlled to facilitate such a speed.

Some embodiments are designed to achieve a minimum IQE (or other related efficiency metric such as external quantum efficiency (EQE) or wall-plug efficiency (WPE)), such that the on-state is characterized by an IQE of at least 1% (or 5%, or 10%) and/or the baseline state is characterized by an IQE of less than 0.1% (or 0.01%). Accordingly, embodiments are configured with a sufficiently-low defect density to achieve the minimum IQE. This leads to a minimum rise/fall time for the active region. Accordingly, embodiments are driven with pulses which are longer than this minimum rise/fall time. Specifically, in some embodiments, the micro-LED 210 has a non-radiative lifetime t_low at low current density (such as the Shockley-Read-Hall (SRH) lifetime), and is driven by pulses whose length is at least half of tau_low (or one, two, five, ten times tau_low).

In some embodiments, the turn-on time t_on is less than 500 ns (or 200 ns, 100 ns, 50 ns, 20 ns, 10 ns). In some embodiments, the SRH lifetime t_SRH (characterizing the active region) is more than 100 ns and t_on is less than 50 ns. In some embodiments, t_on is less than t_SRH divided by two (or three, five, ten). In some embodiments, the charge time t_charge is more than 10 ns and t_on is less than 10 ns. In some embodiments, t_on is less than t_charge divided by two (or three, five, ten). In some embodiments, t_on is less than t_charge+t_SRH divided by two (or three, five, ten). In some embodiments, the SRH lifetime is tied to a sufficient IQE value, as disclosed herein. In some embodiments, the IQE is at least 10% and t_on is less than 500 ns (or 200 ns, 100 ns, 50 ns, 20 ns, 10 ns).

In some embodiments, the electrical pulse driving the LED in the on-state has a duration less than 5 us (or 2 us, 1 us, 500 ns, 200 ns, 100 ns, 50 ns, 10 ns). In some embodiments, light emission in the on-state occurs for a duration which is at least 90% (or 80%, 50%, 20%, 10%) of the duration of the electrical pulse.

Figure 3:
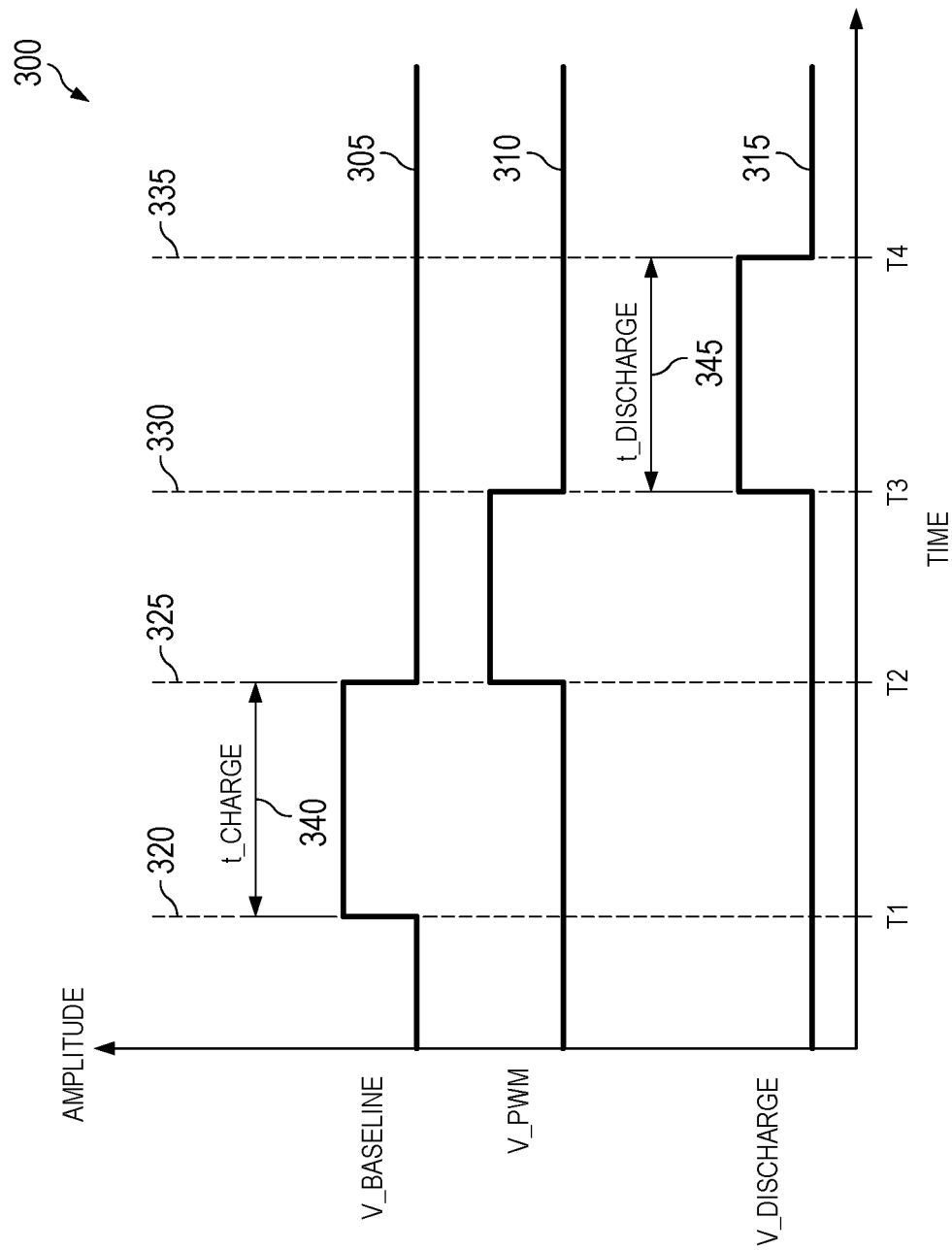
FIG. 3 illustrates a timing scheme in which a micro-LED driver pre-charges a micro-LED with a baseline voltage in accordance with some embodiments.

FIG. 3 illustrates a timing scheme in which the micro-LED driver 205 pre-charges a micro-LED 210 with a baseline power 230 that is represented as a baseline voltage VBASELINE 305 in accordance with some embodiments. The driving power pulse 235 of FIG. 2 is represented as a pulse width modulation (PWM) voltage VPWM 310. FIG. 3 illustrates time traces corresponding to examples of the baseline voltage VBASELINE 305, the pulse width modulation (PWM) voltage VPWM 310, which is the signal that drives light output from the micro-LED 210, and a discharge voltage VDISCHARGE 315. The time traces are offset vertically from each other for clarity.

At time T1 320, the micro-LED driver 205 applies the baseline voltage VBASELINE 305 to the micro-LED 210 for a length of time $t_{charge}$ 340. At time T2 325, the micro-LED driver 205 discontinues the baseline voltage VBASELINE 305 and applies the PWM voltage VPWM 310. The micro-LED driver 205 begins charging the micro-LED 210 with application of the baseline voltage VBASELINE 305, reducing the capacitance charging time after the micro-LED driver 205 applies the PWM voltage VPWM 310, and thus reducing the time between application of the PWM voltage VPWM 310 and the onset of light emission from the micro-LED 210. At time T3 330, the micro-LED driver 205 discontinues application of the PWM voltage VPWM 310 and applies the discharge voltage VDISCHARGE 315 for a length of time $t_{discharge}$ 345 until time T4 335 to remove charge from the micro-LED 210.

Figure 4:
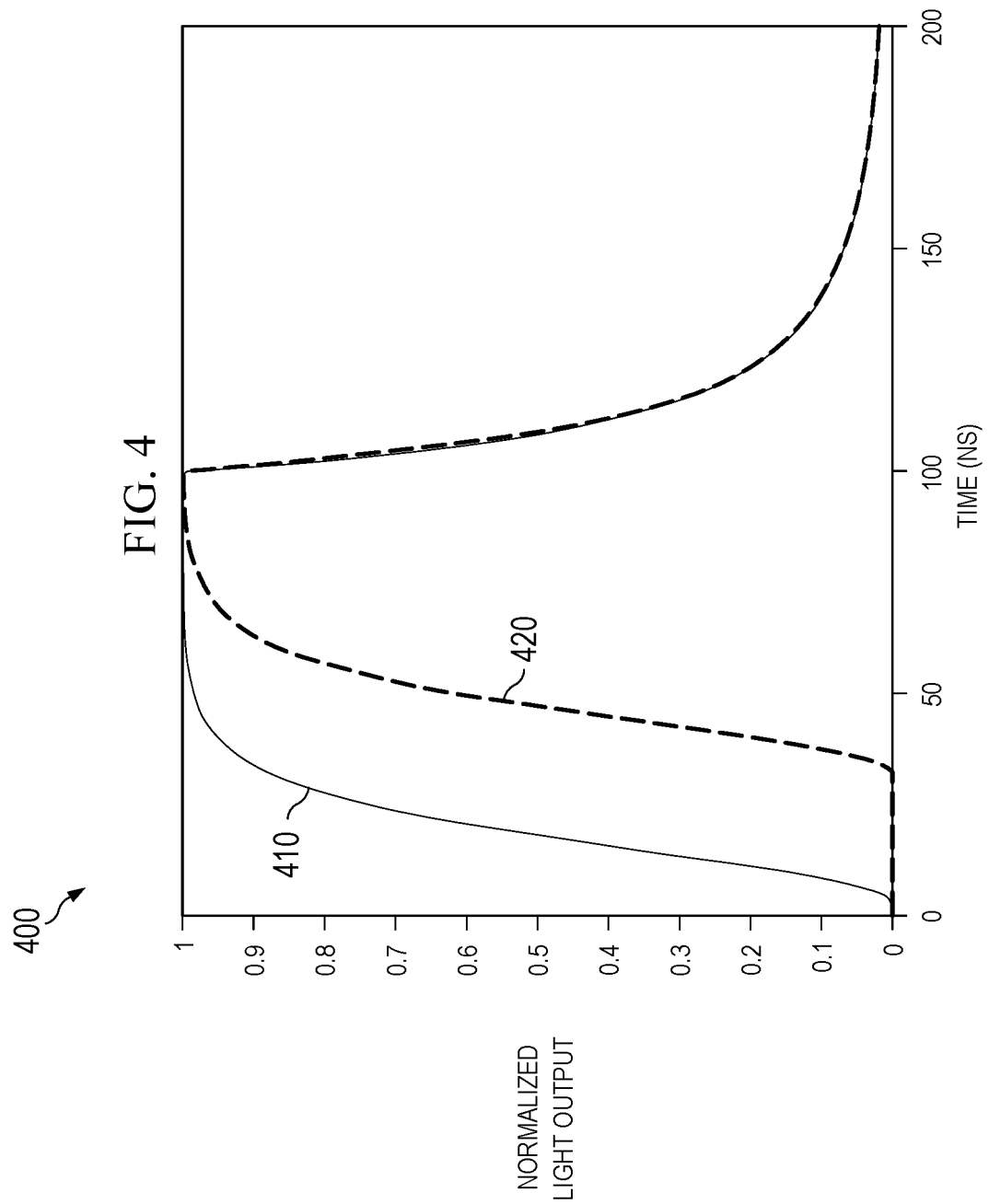
FIG. 4 is a diagram illustrating a comparison of normalized light output from a micro-LED without pre-charging with a baseline voltage and with pre-charging with a baseline voltage in accordance with some embodiments.

FIG. 4 is a diagram illustrating a comparison of normalized light output from a micro-LED without pre-charging with a baseline voltage and with pre-charging with a baseline voltage in accordance with some embodiments. The curve 410 represents normalized light output from a micro-LED 210 that has been pre-charged with a baseline current density corresponding to a baseline voltage prior to application at time 0 ns of a driving PWM current density corresponding to a driving PWM voltage. The curve 420 represents normalized light output from a micro-LED 210 that has not been pre-charged with a baseline current density, and which has been driven by the driving PWM current density corresponding to the driving PWM voltage starting at time 0 ns. As illustrated, the onset of light emission is reduced from approximately 32 ns in curve 420 to approximately 3 ns in curve 410 by applying the baseline current density and baseline voltage. In the illustrated example, the baseline current density is 0.01 A/cm2, corresponding to a baseline voltage of approximately 2.5 V, and the driving PWM current density is 10 A/cm2, corresponding to a driving PWM voltage of approximately 2.7 V. In the baseline (nominally-off) state, the intensity of emitted light is negligible (e.g., less than 10% of the intensity of emitted light in the on-state or, in some cases, about 3E-5 times the light intensity in the on-state, calculated as the ratio of currents times the ratio of IQE) and the consumed power is very small (about 1E-4 times the power in the on-state, calculated as the ratio of currents). In some embodiments, the IQE in the baseline state is less than the IQE in the on-state divided by 10 (or 20, 50, 100).

In some embodiments, the micro-LED driver 205 achieves the nominally-off state by controlling the voltage applied to the micro-LED 210, as controlling voltage may be easier than controlling a very small current, and the micro-LED driver 205 achieves the on-state by controlling the current feeding the micro-LED 210. The micro-LED driver 205 controls the baseline voltage to the micro-LED 210 using a transistor, such as a field effect transistor, or a resistor in some embodiments. In some embodiments, the micro-LED driver 205 maintains the baseline voltage in the nominally-off state at a voltage that is higher than 2 V, and/or that is less than 1 V less than the driving PWM operating voltage.

Figure 5:
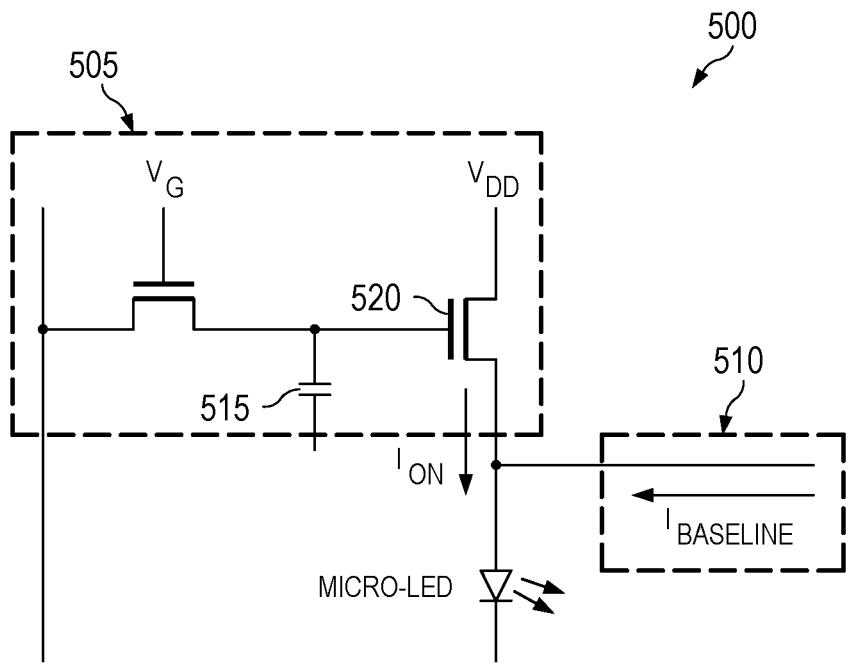
FIG. 5 is a diagram of a micro-LED driver with a first power path to apply pulse width modulation to illuminate a micro-LED and a second power path to apply a baseline current or voltage to the micro-LED in accordance with some embodiments.

FIG. 5 is a diagram of a micro-LED driver 500 with a first path 505 for supplying power to a micro-LED (referred to as first power path 505) to apply a driving pulse width modulation to illuminate a micro-LED and a second power path 510 to apply a baseline current or voltage to the micro-LED in accordance with some embodiments. In some embodiments, the driver is a CMOS, a TFT backbone, or other architecture. The first power path 505 feeds the micro-LED with a column voltage VDD for a display and digital gate control voltage (row select) VG to set the voltage on the capacitor 515. The capacitor 515 stores an analog voltage that turns on the transistor 520, providing a current ION, which in some embodiments has a time-dependent waveform, that flows to the micro-LED, causing substantial light emission when the micro-LED is in an on state, during which no power flows through the second power path 510. In nominally-off mode, no power flows through the first power path 505, but a baseline power consisting of a baseline current Ibaseline or a baseline voltage Vbaseline is applied to the micro-LED through the second power path 510.

In some embodiments, the micro-LED driver 500 does not include the second power path 510, and instead drives the micro-LED (pixel) in a nominally-off state at a low baseline power (voltage or current) at all times. To conserve power, if only a specific area of the display (i.e., a subset of micro-LEDs in an array) is used in a given operation mode, in some embodiments the micro-LED driver 500 applies the baseline power at all times, to only the subset of micro-LEDs corresponding to the specific area of the display that is being used. For example, in some operation modes, a banner on the top of the display is used to show icons, while the rest of the display is off. For such an operation mode, the micro-LED driver 500 applies the baseline power at all times to only the subset of micro-LEDs at the top of the display that form the banner.

In some embodiments, the micro-LED driver 500 drives the nominally-off micro-LEDs (pixels) in one display frame with the baseline power only if the nominally-off pixels will be turned on in the following display frame. Thus, the display system considers the following frame when selecting the driving conditions for the current frame: if pixels are nominally-off (i.e., dark) in the current frame but will be in the on-state in the following frame, the micro-LED driver 500 applies a baseline power in the current frame to improve the response time of the following frame. Consideration of the following frame may increase latency because the next frame information is needed before the current frame can be displayed. Therefore, in some embodiments the display system applies a high refresh rate (such as 90 Hz or 120 Hz or more) to reduce latency.

Figure 6:
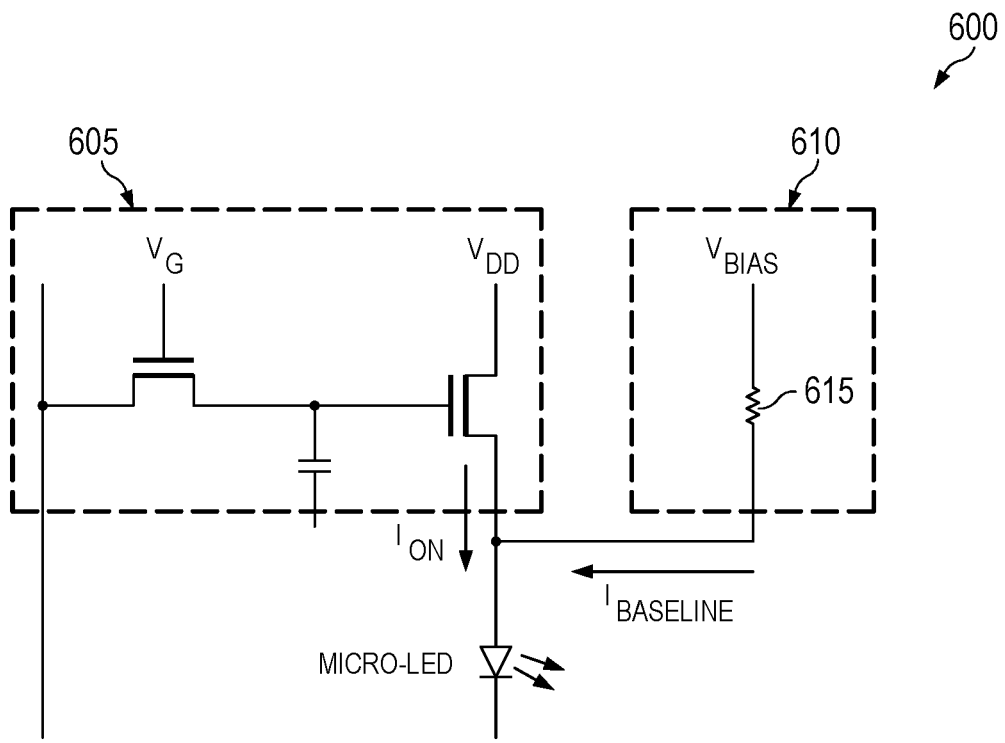
FIG. 6 is a diagram of a micro-LED driver with a second power path including a resistor to convert a bias voltage to a baseline current to a micro-LED in accordance with some embodiments.

FIG. 6 is a diagram of a micro-LED driver 600 with a second power path 610 including a resistor 615 to convert a bias voltage Vbias to a baseline current Ibaseline to feed a micro-LED in accordance with some embodiments. Similar to FIG. 5, a first power path 605 feeds the micro-LED with a voltage VDD when the micro-LED is in an on state, during which little power (e.g., if Vbias is not turned to zero when the micro-LED is in an on state) or no power flows through the second power path 610, and a current ION, which in some embodiments has a time-dependent waveform, flows to the micro-LED, causing substantial light emission. In nominally-off mode, no power flows through the first power path 605, but the resistor converts the bias voltage Vbias to the baseline current Ibaseline, which is applied to the micro-LED through the second power path 610. In some embodiments, Vbias equals VDD, and in other embodiments Vbias differs from VDD.

Figure 7:
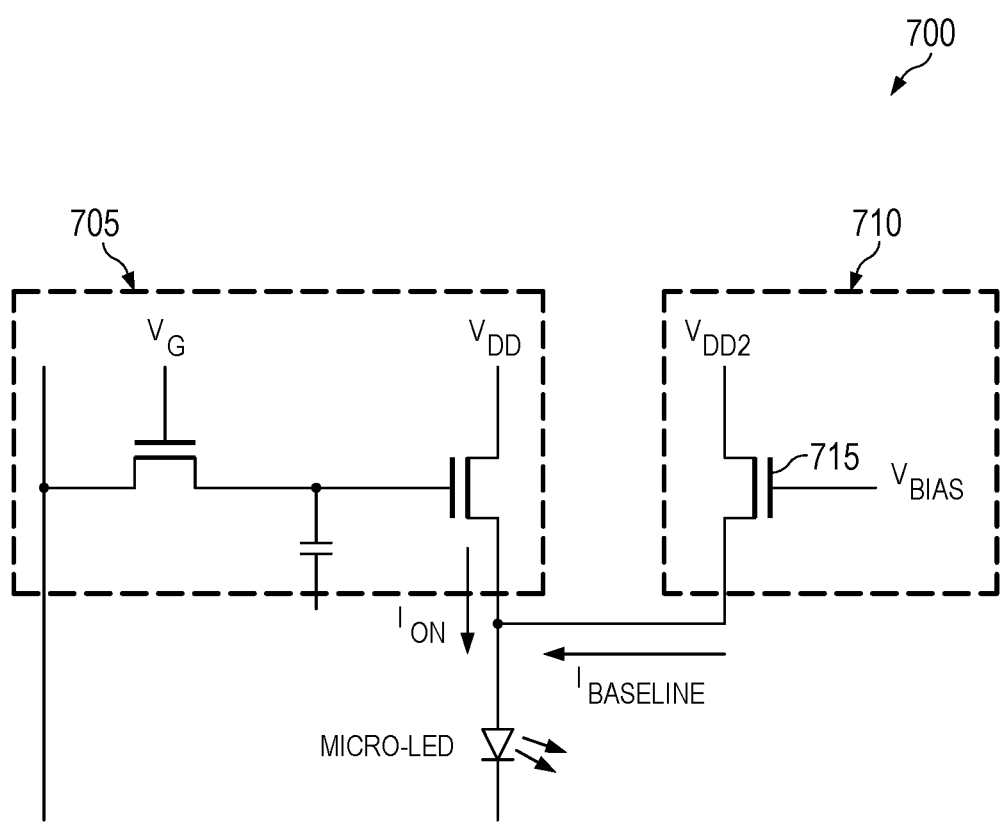
FIG. 7 is a diagram of a micro-LED driver with a second power path including a transistor to apply a baseline current to a micro-LED in accordance with some embodiments.

FIG. 7 is a diagram of a micro-LED driver 700 with a second power path 710 including a transistor 715 to apply a baseline current Ibaseline to a micro-LED in accordance with some embodiments. In the illustrated example, the transistor 715 is a parallel drive transistor. As with FIGS. 5 and 6, a first power path 705 feeds the micro-LED with a voltage VDD when the micro-LED is in an on state, during which no power flows through the second power path 710, and a current ION, which in some embodiments has a time-dependent waveform, flows to the micro-LED, causing substantial light emission. In nominally-off mode, no power flows through the first power path 705, and the baseline current Ibaseline is generated by the transistor 715, with the current value set by Vbias. In some embodiments, VDD2 equals VDD, and in other embodiments VDD2 differs from VDD. Vbias is a direct current (DC) voltage in some embodiments and is a time-dependent voltage in other embodiments.

In some embodiments, the transistor 715 is also used as a discharge transistor to remove charge from the micro-LED once the light-generating current Ion has been turned off. In other embodiments, the transistor 715 in the second power path 710 is used only as a charge transistor and the micro-LED driver 700 includes a third power path (not shown) that includes a separate transistor (not shown) which is used as a discharge transistor.

The driver architectures illustrated in FIGS. 5-7 are examples of architectures that can be used to supply a baseline power to the micro-LED 210. Persons of skill will appreciate that other architectures could be used, such as a second power path including a resistor, as shown in FIG. 6, combined with a third power path including a discharge transistor. In some embodiments, the driver architectures discussed herein pertain to pixels of a display formed from an array of micro-LEDs. Each subpixel corresponds to a micro-LED and micro-LED driver. The baseline current or voltage varies per panel, per region of pixels, per pixel or per subpixel in some embodiments.

For example, the time-response of LEDs of different colors (such as R, G, B) may be different because (i) the junction capacitance depends on the details of the epi structure, which may differ between colors; and (ii) the recombination lifetime depends on the color (at least because of different defect levels and a different radiative lifetime). The capacitance charging time of one color may be at least twice the capacitance charging time of another color. Similarly, the low-current recombination lifetime of one color may be at least twice the low-current recombination lifetime of another color. Thus, different colors can have different behaviors in response to the same pulse shape. Accordingly, in some embodiments, the baseline current or voltage is different for subpixels of different colors (such as R, G, B). In some embodiments, the baseline current or voltage is below the photon voltage of each subpixel (with the photon voltage being defined as equal to the photon energy measured in electron-volts), or below some other threshold voltage. In some embodiments, pulses of different shapes are used for different colors to improve the time-response of each color individually. In some embodiments, the display has at least two colors, and the display is configured such that the turn-on times for the two colors are within a factor of two of each other.

The micro-LED drivers may achieve different baseline powers by using different Vbias values, or a shared Vbias value converted by different electronic components (such as resistors and transistors). In some embodiments, the micro-LED drivers apply the baseline power to facilitate Mura compensation, reducing non-uniformities in a display panel. In some embodiments, each pixel or group of pixels has a different baseline condition, leading to a uniform light output under operation.

For example, in some embodiments, the second power path includes a resistive device that facilitates current leakage. For example, an array can include one or more micro-LEDs of better material quality that start emitting light at lower current than other micro-LEDs of inferior material quality, resulting in uneven brightness at low current. By adding a small leakage path to all pixels, the micro-LEDs of the array are prevented from turning on at low current. The resistance is selected to cause a leakage current which is low compared to the micro-LED's nominally-on current, which facilitates evening out the brightness and/or the response time of a display. In some embodiments, a display has a plurality of micro-LEDs whose low-current non-radiative lifetimes are substantially different (for instance, because the defect level varies between micro-LEDs). Micro-LEDs with more non-radiative recombinations may emit more light and respond more rapidly at low current, leading to inhomogeneity. Accordingly, some embodiments comprise a leakage path which dominates the response time and/or the brightness at low current, thus reducing inhomogeneity.

In some embodiments, the micro-LED drivers do not apply the baseline power (voltage or current) at all times. Instead, the micro-LED drivers only apply the baseline power for a suitable time before the pixels are to be turned on. For instance, if it takes a time $\tau_{baseline}$ to drive a micro-LED from a fully-off state to the baseline state, the micro-LED driver applies the baseline power for a time of at least $\tau_{baseline}$, so that when the pixel (micro-LED) needs to be turned on, the micro-LED is in the baseline state. By applying the baseline power only for the time $\tau_{baseline}$, the micro-LED driver reduces power consumption associated with the baseline condition.

In addition to or in place of pre-charging the micro-LED 210 with a baseline power 230 prior to applying the driving (PWM) power pulse 235, the micro-LED driver 205 may reduce the response time (i.e., the time until the onset of light emission) of the micro-LED 210 by applying a driving power pulse 235 that is shaped to have varying intensity, or current density. In some embodiments, the micro-LED driver 205 applies a driving pulse that is characterized by a complex waveform (i.e., more complex than a simple square shape). For instance, a current or voltage pulse may have a peak or ripples.

Figure 8:
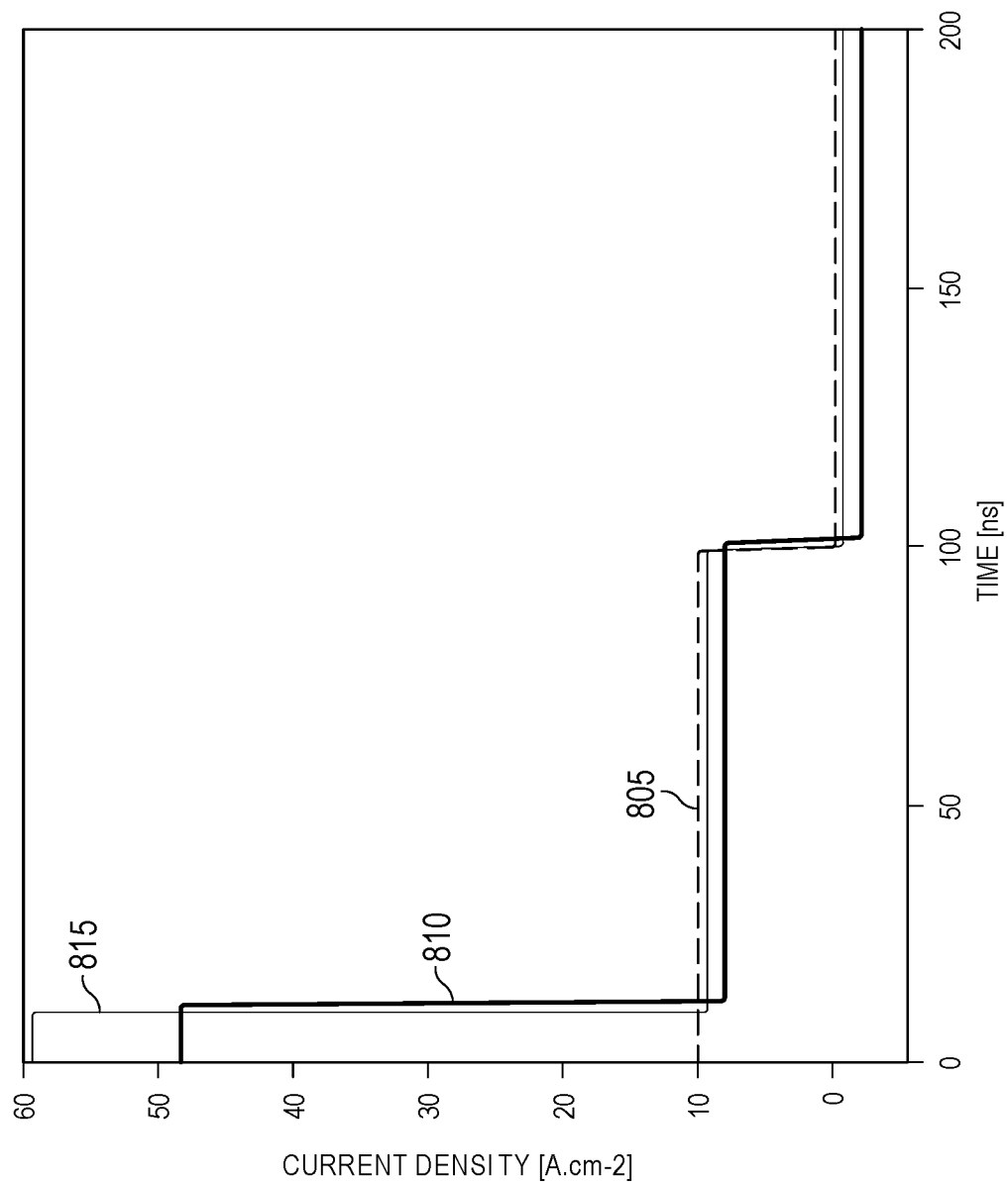
FIG. 8 is a diagram illustrating multiple phases of current pulses to drive a micro-LED in a light-emitting state in accordance with some embodiments.

FIG. 8 is a diagram 800 illustrating different examples of current pulses to drive a micro-LED in a light-emitting state in accordance with some embodiments. The different current pulses are overlaid to illustrate the differences between them. Each pulse has a 100 ns total duration. Current pulse 805 has a simple square profile with a current density of J=10 A/cm2. Current pulse 810 comprises a first phase having a square profile with a current density of J=50 A/cm2 and a duration of around 10 ns, and a second phase with a square profile with a current density of J=10 A/cm2 and a duration of around 90 ns. As such, the total duration of the current pulse 810 is around 100 ns. Current pulse 815 has a first phase having a square profile with a current density of J=60 A/cm2 and a duration of around 10 ns, and a second phase with a square profile with a current density of J=10 A/cm2 and a duration of around 90 ns. As such, the total duration of the current pulse 815 is around 100 ns. In each of the current pulses 810, 815, the first phase immediately precedes the second phase.

Figure 9:
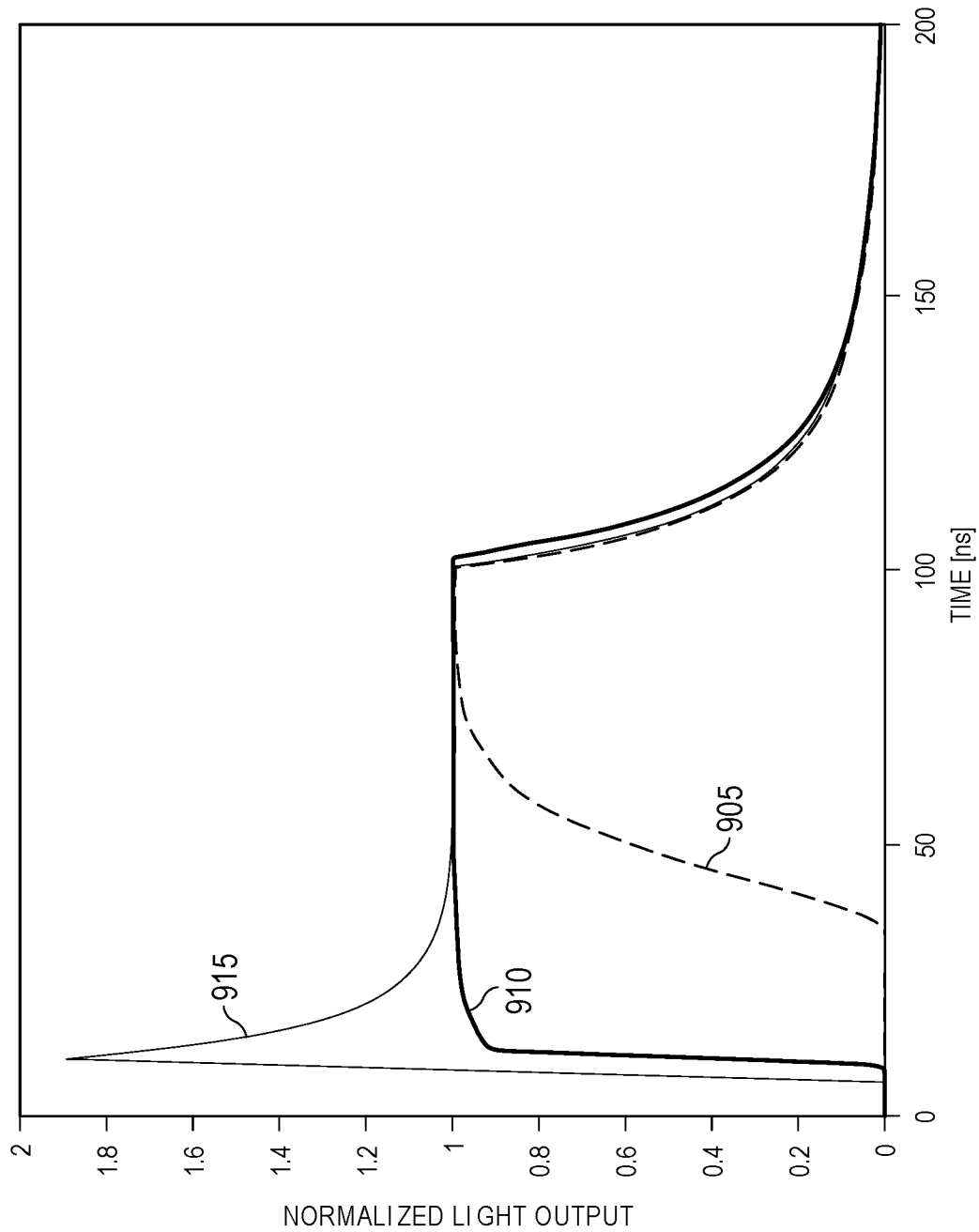
FIG. 9 is a diagram illustrating normalized light output from a micro-LED driven by multiple phases of current pulses in accordance with some embodiments.

FIG. 9 is a diagram 900 illustrating normalized light output from a micro-LED driven by the different current pulses 805, 810, 815 as shown in FIG. 8 in accordance with some embodiments. The normalized light outputs resulting from each of the different current pulses are overlaid to illustrate the differences between them. For the current pulse 805, the normalized light output is illustrated by curve 905. For the current pulse 810, the normalized light output is illustrated by curve 910, and for the current pulse 815, the normalized light output is illustrated by curve 915. As illustrated, a higher current peak (current density), as provided in the first phase of pulses 810 and 815, leads to a faster charging of the micro-LED capacitance and a faster buildup of carriers in the active region, as illustrated by the curves 910 and 915, respectively.

Depending on the length and magnitude of the current peak (i.e., the first phase), the normalized light output may display a peak, because the carrier density in the micro-LED temporarily overshoots its plateau value, as shown for the curve 915 corresponding to the third pulse 815. In some embodiments, the micro-LED driver configures the pulse shape to avoid or limit such overshoot peaks. Avoiding or limiting such peaks may reduce the likelihood of damage to the driver and/or micro-LED. In some embodiments, during a pulse, the current pulse has a peak (i.e., the first phase) and a plateau (i.e., the second phase) and the micro-LED light output has a corresponding peak and plateau, such that the normalized light output peak is less than 2× (or 1.5×, 1.1×) the value of the light output plateau. In some embodiments, the micro-LED driver configures pulses having complex shapes to improve the LED response time. In some embodiments, the current pulse has a duration that is shorter than 1 microsecond and the light-emitting state extends for at least 50% of the current pulse duration. The example waveforms described above are provided as examples only.

In some embodiments, the shapes of the pulses feeding different colors are different. For example, in some embodiments a blue pixel (micro-LED) has a first waveform having a first peak current and duration, a green pixel (micro-LED) has a second waveform having a second peak current and duration, a red pixel (micro-LED) has a third waveform having a third peak current and duration, with the peak currents and durations selected to reduce the turn-on delay to similar values. In some embodiments, a first micro-LED having a first color has a charging time tau_charge_1 and is driven by a first pulse having a first peak value and a first characteristic duration; a second micro-LED having a second color has a charging time tau_charge_2 and is driven by a second pulse having a second peak intensity and a second characteristic duration; tau_charge_2 is at least 2 (or 5, 10) times tau_charge_1, and the product (peak intensity*duration) is higher for the second micro-LED, such that the second micro-LED's time delay before light emission is less than 2 times (or 1.5, 1.2, 3, 5, 10) that of the first micro-LED.

The micro-LED driver applies pulse shaping to one or more of the power pulses causing light output from the LED, the pre-charging baseline pulse, and the discharging pulse.

In some embodiments, a controller (not shown) for the micro-LED driver uses a non-linear conversion between the desired LED brightness and the pulse shape (including length and/or intensity and/or other aspects of the pulse shape) to correct for the non-linearity due to time response. For example, in some embodiments the non-linear conversion is a lookup table that prescribes a given pulse width to achieve a given amount of emitted light.

An example is given in Table 1. This table applies to the micro-LED of FIG. 2 and assumes that simple square pulses with a current density of 10 A/cm2 are applied as the driving power pulse 235. The bit depth is 8, corresponding to up to 256 gray levels. The shortest pulse would last 100 ns in the absence of nonlinear correction.

TABLE 1

| Target gray level | Nominal pulse length [ns] | Uncorrected light amount | Extra pulse length [ns] | Corrected light amount |
|---|---|---|---|---|
| $2^1$ | 100 | 0.65 | 35 | 1 |
| $2^2$ | 200 | 1.65 | 35 | 2 |
| $2^3$ | 400 | 3.65 | 35 | 4 |
| $2^4$ | 800 | 7.65 | 35 | 8 |
| $2^5$ | 1,600 | 15.65 | 35 | 16 |
| $2^6$ | 3,200 | 32.65 | 35 | 32 |
| $2^7$ | 6,400 | 63.65 | 35 | 64 |
| $2^8$ | 12,800 | 127.65 | 35 | 128 |

In this example, an extra pulse length (or time offset) of 35 ns is applied to all gray levels. This extra pulse length corrects the total amount of emitted light and makes it proportional to the target gray level. In the absence of this non-linear correction, the gray levels could be substantially different from their desired values, especially for low gray levels. That is, by extending the length of all pulses by 35 ns (in the example described above), it is possible to compensate for the time taken for light emission to begin (or reach 90% of the full value).

Applying an arbitrary time offset to pulses may be difficult if the time offset is not proportional to the display system's base clock time. Accordingly, some embodiments are configured such that the necessary time offset is close to the clock time. For instance, in the example above, a clock time of 33.333 ns can produce time offsets that are very close to the values of Table 1 (e.g., the shortest pulse lasts 4 clock cycles instead of 3). In some embodiments, other hardware such as a delay line is used to add a delay whose length is not dictated by the clock period.

In this example, the extra pulse length is constant for all gray levels and a full lookup table is superfluous. However, other schemes may require a correction that depends on the gray level. This may occur for instance if the pulse driving current depends on the gray level, or if hysteresis effects (i.e., the state of the pixel before the pulse of interest) are taken into account.

The lookup table may be more or less granular, and present non-linear correction values for more or fewer gray levels. For gray levels in between the levels of the lookup table, the extra pulse length may be interpolated. The values of such a look-up table may vary across elements of the display (for instance, different regions, different pixels, different subpixels, different LED colors). Additional bits, for instance 12 bit (8 for display and 4 for the correction) may be used to set the values for individual elements.

In some embodiments, the controller applies the non-linear correction on its own, or combined with other teachings of this disclosure. For instance, the micro-LED and/or the micro-LED driver may be configured to allow an approximate minimum desired pulse length (e.g., on the order of 10 ns or 50 ns or 100 ns or 500 ns or 1 us), and non-linear correction may be applied to further control the light levels and correct residual time-response effects. In the example above, the micro-LED and micro-LED driver are configured to allow shortest pulses of approximately 100 ns, and non-linear correction is applied to precisely control the gray levels. The current density of the pulse may also be configured via a lookup table.

Table 1 assumes that the desired light amount is strictly proportional to the bit depth. However, gamma correction may further be applied. Non-linear correction may be configured to achieve the desired gray level after gamma correction. The lookup table may be populated with values that are determined by applying a calibration process to the display, for example measuring the light values for different durations to determine how to modify pulse durations or current density of the pulses.

Embodiments comprise methods of configuring a driving scheme, as disclosed herein, to achieve a desired amount of light. The method may include the following steps: determine a desired output (for instance a nominal brightness level corresponding to a bit depth); operate a display with a suited driving scheme (e.g., pulse shape and duration) to achieve an actual output which is within a predetermined range of the desired output (e.g., within +/−10% or 20% or 5% or 1%).

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   driving a first micro light emitting diode (micro-LED) having a lateral dimension that is smaller than 20 μm in a nominally-off state at a first baseline power greater than zero; and
   driving the first micro-LED in a light-emitting state at a power greater than the first baseline power, wherein an amount of light emitted by the first micro-LED in the nominally-off state is negligible compared to a minimum amount of light emitted by the first micro-LED in the light-emitting state.

2. The method of claim 1, wherein driving the first micro-LED at the first baseline power comprises:
   applying the first baseline power prior to driving the first micro-LED in the light-emitting state.

3. The method of claim 1, further comprising:
   driving a second micro-LED in a nominally-off state at a second baseline power greater than zero, wherein the second baseline power is different from the first baseline power.

4. The method of claim 1, wherein driving the first micro-LED in the light-emitting state comprises:
   driving the first micro-LED with a current pulse comprising a first phase having a relatively higher current density and a second phase having a relatively lower current density.

5. The method of claim 1, wherein the amount of light emitted by the micro-LED in the nominally-off state is less than 0.1% of the minimum amount of light emitted by the first micro-LED in the light-emitting state and wherein the light-emitting state is characterized by an internal quantum efficiency of at least 10%.

6. The method of claim 1, wherein
   driving the first micro-LED in the nominally-off state comprises driving the first micro-LED via a first power path; and
   driving the first micro-LED in the light-emitting state comprises driving the first micro-LED via a second power path different from the first power path.

7. The method of claim 1, wherein a turn-on time between the nominally-off state and the light-emitting state is less than 500 ns.

8. A method, comprising:
   driving a first micro light emitting diode (micro-LED) of a display comprising an array of micro-LEDs, each micro-LED in the array having a lateral dimension that is smaller than 20 μm, in a light-emitting state with a current pulse comprising a first phase having a relatively higher current density and a second phase having a relatively lower current density, wherein
   the current pulse has a duration that is shorter than 1 microsecond and wherein the light-emitting state extends for at least 50% of the current pulse duration.

9. The method of claim 8, wherein the first phase has a current density at least twice the current density of the second phase.

10. The method of claim 8, further comprising:
    driving the first micro-LED in a nominally-off state at a first baseline power greater than zero; and
    driving the first micro-LED in the light-emitting state at a power greater than the first baseline power, wherein an amount of light emitted by the micro-LED in the nominally-off state is negligible compared to a minimum amount of light emitted by the first micro-LED in the light-emitting state.

11. The method of claim 10, wherein driving the first micro-LED at the first baseline power comprises:
    applying the first baseline power prior to driving the first micro-LED in the light-emitting state.

12. The method of claim 10, further comprising:
    driving a second micro-LED of the array in a nominally-off state at a second baseline power greater than zero, wherein the second baseline power is different from the first baseline power.

13. The method of claim 10, wherein
    driving the first micro-LED in the nominally-off state comprises driving the first micro-LED via a first power path; and
    driving the first micro-LED in the light-emitting state comprises driving the first micro-LED via a second power path different from the first power path.

14. The method of claim 10, wherein the amount of light emitted by the micro-LED in the nominally-off state is less than 0.1% of the minimum amount of light emitted by the first micro-LED in the light-emitting state and wherein the light-emitting state is characterized by an internal quantum efficiency of at least 10%.

15. A device, comprising:
    a first micro light emitting diode (micro-LED) having a lateral dimension that is smaller than 20 μm; and
    a driver configured to:
       drive the first micro-LED in a nominally-off state at a first baseline power greater than zero; and
       drive the first micro-LED in a light-emitting state at a power greater than the first baseline power, wherein an amount of light emitted by the micro-LED in the nominally-off state is negligible compared to a minimum amount of light emitted by the first micro-LED in the light-emitting state.

16. The device of claim 15, wherein the driver is further configured to:
    apply the first baseline power to the first micro-LED prior to driving the first micro-LED in the light-emitting state.

17. The device of claim 15, further comprising:
    a second micro-LED, wherein the driver is configured to drive the second micro-LED in a nominally-off state at a second baseline power greater than zero, wherein the second baseline power is different from the first baseline power.

18. The device of claim 15, wherein the driver is further configured to:
    drive the first micro-LED in the light-emitting state with a current pulse comprising a first phase having a relatively higher current density and a second phase having a relatively lower current density.

19. The device of claim 15, wherein the amount of light emitted by the micro-LED in the nominally-off state is less than 0.1% of the minimum amount of light emitted by the first micro-LED in the light-emitting state and wherein the light-emitting state is characterized by an internal quantum efficiency of at least 10%.

20. The device of claim 15, wherein the driver comprises:
    a first power path to drive the first micro-LED in the nominally-off state at the first baseline power; and a second power path different from the first power path to drive the first micro-LED in the light-emitting state.

* * * * *